United States Patent [19]
Hynes

[11] Patent Number: 5,485,101
[45] Date of Patent: Jan. 16, 1996

[54] FREQUENCY ANALYZER FOR SUB-MICROSECOND TESTING

[76] Inventor: Mark Hynes, 3208 Oakmont Dr., Sierra Vista, Ariz. 85635

[21] Appl. No.: 47,527

[22] Filed: Apr. 14, 1993

[51] Int. Cl.[6] .................................... G01R 23/00
[52] U.S. Cl. ............... 324/617; 324/618; 324/76.54; 341/120; 331/44
[58] Field of Search .................. 324/617, 618; 341/120; 331/DIG. 2, 179, 44

[56] References Cited

U.S. PATENT DOCUMENTS

| 3,852,681 | 12/1974 | Underhill | 331/179 |
| 4,578,641 | 3/1986 | Tiedje | 324/617 |

FOREIGN PATENT DOCUMENTS

| 576121 | 5/1959 | Canada | 331/44 |
| 363931 | 12/1972 | U.S.S.R. | 324/617 |

*Primary Examiner*—Kenneth A. Wieder
*Assistant Examiner*—Jose M. Solis
*Attorney, Agent, or Firm*—Freda L. Krosnick; Frank J. Dynda

[57] ABSTRACT

A method and apparatus for measuring the settling time of frequency changes in a voltage controlled oscillator (VCO) are disclosed. A signal splitter is responsive to the VCO for splitting the output signal between first and second channels. A delay circuit in one of the channels introduces a delay and corresponding phase shift of one signal relative to the other, and a phase detector produces a phase signal proportional to the phase shift indicative of the settling time of the VCO. A control circuit coupled to the phase detector and the VCO produces a step voltage initiating signal for changing the VCO output frequency. A detector responsive to the initiating signal and the phase signal produces an output indicative of the settling time with respect to the control signal in the modulation domain.

12 Claims, 3 Drawing Sheets

//5,485,101

FREQUENCY ANALYZER FOR SUB-MICROSECOND TESTING

RIGHTS OF THE GOVERNMENT

The invention described herein may be manufactured, used and licensed by or for the United States Government for governmental purposes without the payment to me of any royalty thereon.

BACKGROUND OF THE INVENTION

The invention pertains to microwave test instrumentation and in particular to an instrument employing a delay line and a phase detector capable of sub-microsecond modulation domain testing.

Electronic simulators are capable of replicating high density radar signals. One such simulator employs computer modeling to formulate real time parameters of platforms and emitters in the environment, as well as microwave hardware to generate the actual microwave signals received by the system under test. The modeling entails calculating, in real time, parameters such as platform position, propagation path loss, and emitter events, while the microwave hardware generates pulses with the appropriate parameters.

The design of generators useful in such simulators is dependent on the speed of the settling time of microwave voltage controlled oscillators (VCOs) employed in the design. In order to provide for interleaved radar pulses, for example, the generator must switch from any frequency to any other frequency in the desired range, e.g. 500 MHz to 18 GHz to any other frequency in the range in under 300 ns. For an average pulse width of one microsecond, the VCO settling time significantly affects the pulse through put capability of the system. Further, if the VCO frequency settling time is slower than required, unintentional frequency-modulation-on-pulse (FMOP) will result. This unintentional FMOP is unacceptable. The simulator is designed to accurately simulate fine grain FMOP, which it cannot do if there is residual FMOP due to the VCO settling characteristics.

There are currently no instruments commercially available which can measure the frequency settling time with the required resolution. This measurement is in the modulation domain, that is, frequency versus time. Neither a spectrum analyzer nor an oscilloscope is capable of making modulation domain measurements. The spectrum analyzer measures amplitude versus frequency but cannot acquire the time information. The oscilloscope measures amplitude versus time, but cannot acquire the frequency information.

Modulation domain analyzers, such as HP-5371A and HP-5372A manufactured by Hewlett-Packard, use a gated frequency counter technique and lack the necessary accuracy of resolution. These instruments use digital frequency counter techniques, and are thus limited in accuracy and resolution by the sampling rate. For example, the sampling rate of these instruments is not sufficiently fast to give a frequency accuracy of 0.1 MHz, and a time resolution of 12.4 ns, as required for high speed VCO settling measurements.

Therefore, there is a need to accurately measure the modulation domain performance of the voltage controlled microwave oscillators within the system.

SUMMARY OF THE INVENTION

The present invention is based upon the discovery that a phase detector responsive to the phase difference between the VCO signal and a delayed replica of the VCO signal produces an output indicative of the settling time resulting from changes in the VCO output.

In a particular embodiment, the invention is directed to an apparatus for measuring the settling time of frequency changes in a voltage controlled oscillator output signal. A signal splitter is adapted to be responsive to the VCO output signal for splitting the signal between first and second channels and producing first and second signals on the respective first and second channels. A delay circuit in one of the channels introduces a delay in the corresponding signal carried thereby and a phase detector is coupled to the first and second channels is responsive to a phase difference between the first and second signals resulting from the delay of one with respect to the other. The phase difference is indicative of the frequency offset from the final settled frequency. A control is adapted to be coupled to the VCO for initiating the change in the VCO output frequency. Means responsive to the phase detector and the control produces an output indicative of the settling time with respect to the initiation of the change in the VCO output.

DESCRIPTION OF THE INVENTION

Figure 1:
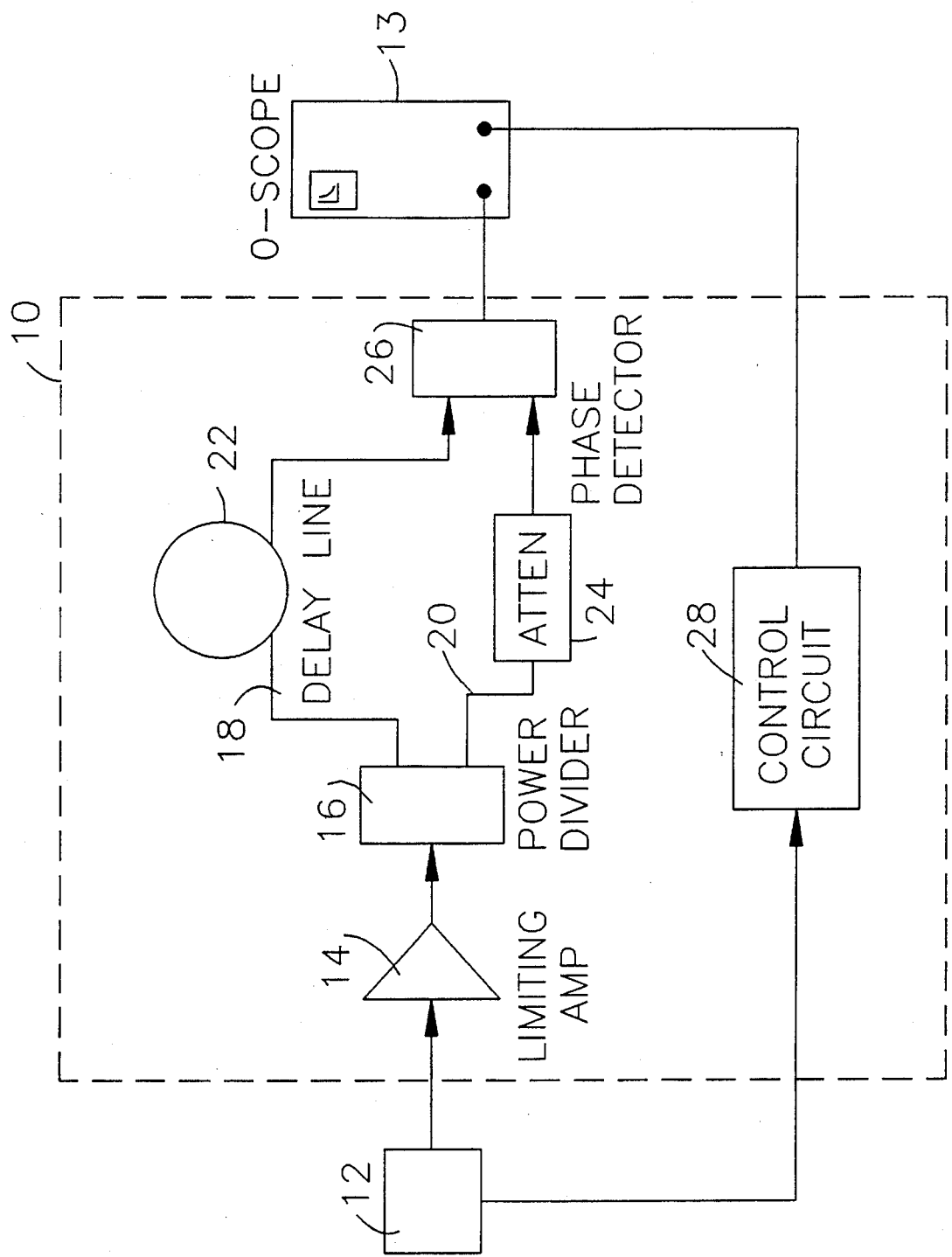
FIG. 1 is a schematic block diagram of a frequency analyzer for sub-microsecond testing in accordance with the present invention, showing connections to a device under test and a display.

A frequency analyzer for sub-microsecond testing or frequency analyzer 10 is illustrated in FIG. 1. The frequency analyzer 10 is an apparatus for testing the settling time of a voltage controlled oscillator (VCO) 12. A display device such as an oscilloscope 13 is coupled to the frequency analyzer 10 as illustrated and as hereinafter described.

The VCO 12 to be tested is coupled to a limiting amplifier 14 which suppresses amplitude modulation (AM) to frequency modulation (FM) conversion. The signal is then directed to a power divider 16 which splits the signal between respective first and second channels 18 and 20. The first channel 18 has a delay line 22. The second channel 20 has an optional attenuator 24 to balance the signal level in the respective first and second channels 18 and 20. A phase detector 26 is coupled to the balanced output of the delay line 22 and the attenuator 24. The output of the phase detector is a voltage, representing the VCO output frequency. The oscilloscope 13 is used to measure the voltage level, and can be calibrated to read in units of frequency, i.e. MHz.

A control circuit 28 controls the VCO 12 and produces a timing signal as a reference to the oscilloscope 13 against which the settling time of the VCO 12 is measured. The timing signal marks the time at which the frequency command initiating a change in frequency reaches the VCO, thus eliminating any potential errors due to delay in the circuitry. The settling time is then measured and displayed on the oscilloscope 13 as the time between when the timing signal is initiated and when the VCO 12 has settled to within a desired frequency range, for example, + or −0.5 MHz.

The frequency analyzer 10 obtains its significant level of performance by employing a technique whereby it converts a frequency difference to a phase difference using the delay line 22. The phase detector 26 is used to convert the phase difference to a voltage difference, which is displayed on the calibrated scope 14. This gives frequency versus time, or a modulation domain measurement.

The only delay encountered using this technique is the delay associated with RF propagation through the RF components and the delay line 22, the delay line being the predominant contributor. The accuracy of the frequency analyzer 10 is limited only by this delay, and not by sampling rate, as in the case of the sampling technique used in known devices.

The delay in the signal can be calculated from the length of the delay line as:

$$D = L/V_p \text{ (seconds)}$$

where L is the length of the delay line 22 and $V_p$ is the velocity of propagation in the delay line, with, $$V_p = \frac{1}{\sqrt{\mu_0 \mu_r \epsilon_0 \epsilon_r}}$$

The free space permeability and permittivity can be factored out using the equation:

$$c = \frac{1}{\sqrt{\mu_0 \epsilon_0}}$$

which gives the velocity of propagation in terms of the free space speed of light, c, and the relative permeability and the relative permittivity of the propagation medium.

$$V_p = \frac{c}{\sqrt{\mu_r \epsilon_r}}$$

or $$V_p = \frac{c}{\sqrt{E}}$$

where E is the dielectric constant. In the embodiment described herein, the dielectric is a polytetrafluorethelyene (PTFE), such as a material sold under the trademark TEFLON, having a dielectric constant E of 1.5.

The dielectric constant changes very little over frequency in PTFE, thus, it can be assumed, given constant temperature, that the dominant effect on phase at the phase detector input is due to the change in wavelength of the VCO signal under test.

The delay is approximately 1.24 ns per foot of PTFE delay line 22. The length of the delay line 22 to give the frequency analyzer 10 sufficient sensitivity in the 12 to 18 GHz frequency range is about 10 feet. This gives a delay of 12.4 ns. An uncertainty of 12.4 ns is acceptable for measuring VCOs with settling times as low as 100 ns.

The phase change seen by the phase detector 26 due to a change in input frequency is given in terms of wavelength and delay line 22 length as:

$$\Delta\phi = L \left( \frac{1}{\lambda} - \frac{1}{\lambda + \Delta\lambda} \right) * 360$$

where $\lambda$ is the initial wavelength in meters, $\Delta\lambda$ is the change in wavelength, and L is the length of the delay line 22 in meters.

At 12 GHz, a 1 MHz frequency change would give a phase change of 4.48 degrees. This gives a sensitivity at the output of the phase detector of approximately 35 mV per MHz, and a range of 20 MHz. This represents a very fine grain, high speed frequency measurement over a limited frequency range, a measurement capability ideally suited to measurement of high speed VCOs.

Figure 2A:
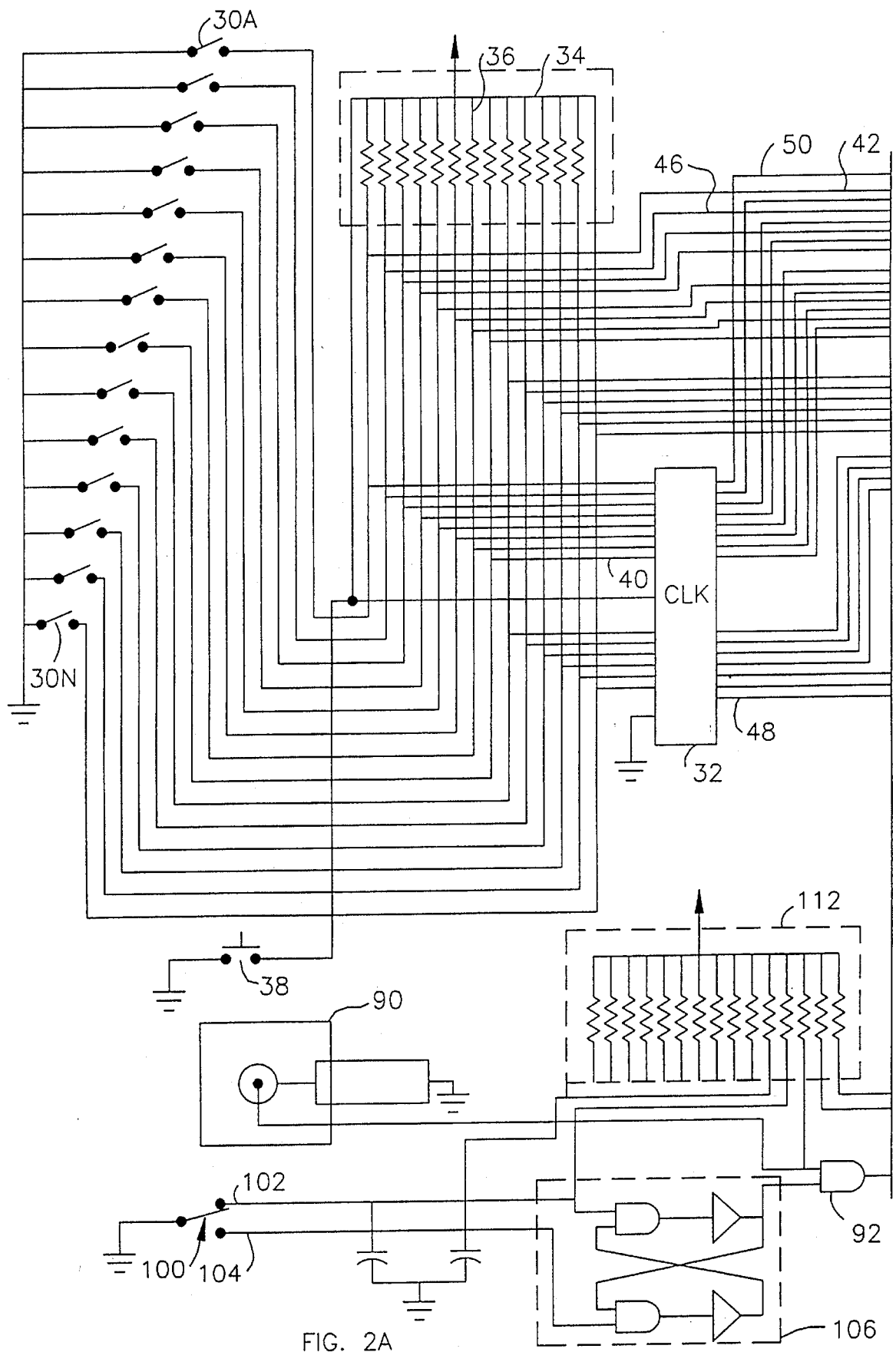
FIGS. 2a and 2b taken together form a detailed schematic diagram of a control circuit shown in FIG. 1.
Figure 2B:
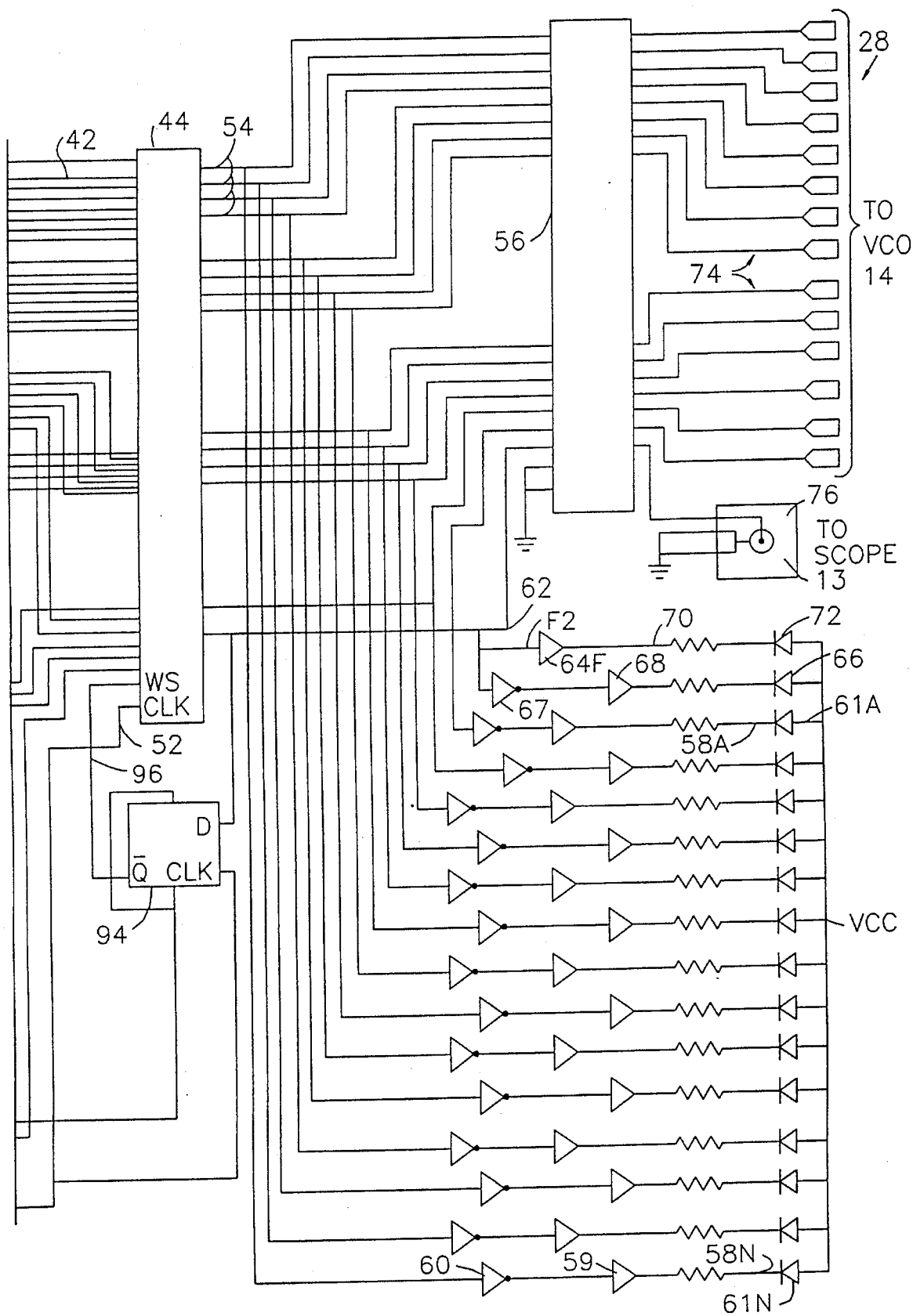

The control circuit 28 detailed in FIGS. 2a and 2b taken side by side include means for storing codes representing two frequencies between which the VCO 12 is to be switched and means for switching between the frequencies while at the same time providing an external trigger for the oscilloscope 13.

A set of binary switches 30(a) ... 30(n) is coupled to the input of a register 32 by a pull up circuit 34 which includes a plurality of resistors 36 coupled to a supply voltage. When it is desired to load a frequency (e.g. frequency 2) the switches 30(a) ... 30(n) are selectively set to establish a voltage in binary format which represents corresponding voltage inputs for the VCO which causes it to produce an output at the desired frequency (F2). When the manual switches 30(a) ... 30(n) are set, a normally open load F2 switch 38, coupled to the pull up circuit 34 and a clock input 40 of the register 32 causes the condition of the switches 30(a) ... 30(n) to be stored in the register 32. Thereafter, the load F2 switch 38 is released to its normally open condition.

After F2 is set, F1 is set simply by configuring the switches 30(a) ... 30(n) in a desired binary format to represent F1. The switches 30(a) ... 30(n) are coupled to F1 inputs 42 of a gating circuit 44 over leads 46. Likewise, the output leads 48 of the register 32 are coupled to F2 inputs 50 of the gate 44. Clock signal on clock input 52 of the gate 44 causes the outputs 54 thereof to toggle between voltage levels representing F1 and F2 respectively for each clock pulse. The outputs 54 of the gate 44 are coupled to a buffer circuit 56 which is, in turn, coupled to the VCO as shown. The outputs 54 of the gate circuit 44 are also coupled to drivers 58(a) ... 58(n) which may include both an amplifier 59 and an inverter 60 as illustrated. The drivers 58(a) ... 58(n) are coupled to light emitting diodes (LEDs) 61(a)–61(n). The condition of the outputs 54 of the gate 44 are reflected on the LEDs 61(a)–61(n). Differentiation between F1 and F2 is sensed on a lead 62 of the gate 44. For example, when the lead 62 is high, a driver amplifier 64 representative of F2 is enabled thereby causing an interconnected F1 LED 66 driver which includes amplifier 67 and inverter 69 to go low causing F2 LED 66 to be illuminated. Likewise, when 62 is low, LED 66 turns off and F2 LED driver 70 goes low causing LED 72 to become illuminated.

Each time the gate 44 is switched between F1 and F2, VCO 14 receives the frequency control input via leads 74 of the control circuit 28. At the same time, a trigger lead 76 coupled to the oscilloscope delivers a pulse in synchronism with the VCO input which establishes the time base for the system.

Thus, each time the system switches between F1 and F2, the VCO 12 receives a frequency control input and at the same time the scope 13 receives a trigger signal simultaneously therewith.

System timing may be achieved manually or automatically as desired. In automatic mode, a clock input 90 is coupled via a gate 92 to the clock input (C) of a flip flop 94. Each time the clock input C is triggered low, it produces a clock output 96 which is coupled to a switch input 96 of the gate 44. Each pulse on the switch input 96 causes the gate 44 to switch between F1 and F2 respectively.

In manual mode, a switch 100 which has a normally closed contact 102 and a normally open contact 104 may be manually actuated. The switch 100 is coupled to a flip flop 106 which includes a pair of gates 108 and corresponding inverters 110 coupled in feedback relation with the gate inputs, and with the switching gate 92. The switches 102 and 104 are coupled to inputs of the gate 108 and pull up circuit 112. When switch 102 is closed, the flip flop 106 produces an output which enables gate 92 which, in turn, actuates the clock input 52 of the gate 44. The flip flop 106 acts as a toggle and isolates the digital circuits from contact bounce by manual actuation of switch 100. The operation of the flip flop 106 should be apparent to those skilled in the art and further description is believed to be unnecessary.

In accordance with the invention, therefore synchronous and closely timed cycling of the VCO may be monitored by the oscilloscope so that an accurate measurement of modulation domain characteristics of microwave signals in the high frequency range, e.g. 12 to 18 GHz frequency range is achieved. The time resolution of the frequency analyzer of the present invention is about 12.4 ns and frequency accuracy is about 1/10 MHz. The system may measure with such accuracy and resolution the frequency settling characteristics of any VCO that operates in that frequency range. The frequency VCO is switched between the two frequencies by the digital control circuit which also drives the oscilloscope display.

The system may also be employed for other applications requiring accurate switching and synchronization. In the embodiment illustrated, the frequency analyzer converts frequency difference to a phase difference using a delay line. A phase detector is then used to convert the phase difference to a voltage difference which is displayed on a calibrated scope. This technique provides frequency versus time or modulation domain measurements.

While there has been described what at present are considered to be the preferred embodiments of the present invention, it will be readily apparent to those skilled in the art that various changes and modifications may be made therein without departing from the invention and it is intended in the appended claims to cover such changes and modifications as fall within the true spirit and scope of the invention.

What is claimed is:

1. Apparatus for measuring the settling time of frequency changes in a voltage controlled oscillator (VCO) output signal initiated by an initiating signal comprising:

signal splitting means adapted to be responsive to the VCO output signal, having first and second channels for splitting the VCO output signal therebetween, the first and second channels for carrying corresponding first and second signals;

a delay circuit in one of said channels for introducing a delay in the corresponding signal carried thereby;

phase detector means coupled between the channels and being responsive for detecting a phase difference between the first and second signals and producing an output indicative thereof, said phase difference being indicative of the settling time of the VCO output signal;

control means coupled to the VCO for producing the initiating signal for changing the VCO output frequency; and means responsive to the phase difference output and the initiating signal for producing an output indicative of the settling time with respect to the control signal.

2. The apparatus according to claim 1 wherein the signal splitting means comprises a power divider.

3. The apparatus according to claim 1 wherein the delay line includes a dielectric element.

4. The apparatus according to claim 3 wherein the dielectric is a polytetrafluoroethelene composition having a dielectric constant of about 1.5.

5. The apparatus according to claim 1 wherein the control circuit includes a register for storing a selectable control signal representative of each frequency.

6. The apparatus according to claim 5 wherein the register comprises a plurality of manually actuable switches.

7. The apparatus according to claim 6 further comprising a pull-up circuit coupled to the switches and a supply voltage for the pull-up circuit.

8. The apparatus according to claim 5 wherein the control circuit includes a gate circuit responsive to each register for selecting between each frequency stored in each register.

9. The apparatus according to claim 8 further comprising toggle means coupled to the gate circuit for causing the register to select each frequency in sequence.

10. The apparatus according to claim 9 wherein the toggle means comprises a flip-flop circuit for driving the register between states for each frequency.

11. The apparatus according to claim 1 further comprising an attenuator in one of said channels for balancing the amplitude of the first and second signals.

12. A method for measuring the settling time of frequency changes in a voltage controlled oscillator (VCO) output signal in the modulation domain comprising the steps of:

splitting the VCO output signal between first and second channels for carrying corresponding first and second signals;

delaying the signal in one of said channels relative to the other for introducing a phase shift therebetween;

detecting the phase difference between the first and second signals for producing a phase signal;

initiating a signal for changing the VCO output frequency; and detecting the phase signal and the initiating signal for producing an output indicative of the settling time of the VCO with respect to the initiation thereof in the modulation domain.

* * * * *